United States Patent
Selbrede et al.

(10) Patent No.: US 6,835,278 B2
(45) Date of Patent: Dec. 28, 2004

(54) SYSTEMS AND METHODS FOR REMOTE PLASMA CLEAN

(75) Inventors: Steven C. Selbrede, San Jose, CA (US); Neil M. Mackie, Fremont, CA (US); Martin L. Zucker, Orinda, CA (US)

(73) Assignee: Mattson Technology Inc., Fremont, CA (US)

( * ) Notice: Subject to any disclaimer, the term of this patent is extended or adjusted under 35 U.S.C. 154(b) by 254 days.

(21) Appl. No.: 09/896,283

(22) Filed: Jun. 29, 2001

(65) Prior Publication Data

US 2002/0020429 A1 Feb. 21, 2002

Related U.S. Application Data

(60) Provisional application No. 60/216,603, filed on Jul. 7, 2000.

(51) Int. Cl.[7] .............................. C23F 1/00; B08B 7/00
(52) U.S. Cl. ............................ 156/345.35; 156/345.24; 134/1.1; 438/905
(58) Field of Search ............................ 134/1, 1.1, 902; 438/905; 156/345.33, 345.35, 345.54, 345.29, 345.24

(56) References Cited

U.S. PATENT DOCUMENTS

| | | | |
|---|---|---|---|
| 4,088,926 A | | 5/1978 | Fletcher et al. |
| 6,109,206 A | | 8/2000 | Maydan et al. |
| 6,125,859 A | * | 10/2000 | Kao et al. .................... 134/1.1 |
| 6,150,628 A | | 11/2000 | Smith et al. |
| 6,255,222 B1 | * | 7/2001 | Xia et al. .................... 438/710 |
| 6,271,148 B1 | | 8/2001 | Kao et al. |
| 6,274,058 B1 | * | 8/2001 | Rajagopalan et al. ......... 216/67 |
| 6,388,226 B1 | | 5/2002 | Smith et al. |

* cited by examiner

Primary Examiner—Alexander Markoff
(74) Attorney, Agent, or Firm—Wilson Sonsini Goodrich & Rosati

(57) ABSTRACT

A remote plasma cleaning system includes a high conductance delivery line that delivers activated species from a remote plasma generator to a processing chamber. The delivery line preferably has a conductance of greater than 40 liters per second, enabling the power levels of the remote plasma generator to be maintained at less than about 3 kW. In one embodiment, activated species may be introduced into the processing chamber via one or more inlet ports disposed in a side portion of the processing chamber. In another embodiment, a coaxial inject/exhaust assembly enables activated species to be introduced into the processing chamber via an inner tube and gases to be exhausted from the processing chamber via an outer tube. Other embodiments incorporate an compound valve in the delivery system for selectively isolating the RPC chamber from the processing chamber and an optical baffle for protecting sensitive components of the isolation valve from exposure to ion bombardment and plasma radiation. The processing chamber may also include flow channels that enable activated species to clean cavities and components located underneath the susceptor, such as lift pin assemblies. Endpoint detection of the remote plasma clean may be performed by igniting a second low-power plasma in the processing chamber from activated species generated by the remote plasma generator, and monitoring emission lines (or ratios thereof) from the second plasma using an optical detector.

16 Claims, 12 Drawing Sheets

SYSTEMS AND METHODS FOR REMOTE PLASMA CLEAN

REFERENCE TO RELATED APPLICATIONS

The present application claims priority from Provisional Application No. 60/216,603, filed Jul. 7, 2000. Provisional Application No. 60/216,603 is hereby incorporated herein by reference in its entirety.

BACKGROUND

1. Field of the Invention

The present invention generally relates to cleaning semiconductor processing chambers, and more particularly, to systems and methods for cleaning a semiconductor processing chamber using a remote plasma source.

2. Description of the Related Art

Conventional techniques for removing undesired deposits, films, and residues from the surfaces of hardware located inside a processing chamber typically involve so-called direct plasma clean methods. In such methods, cleaning gases are injected and plasmas are generated directly within the processing chamber. Plasma-activated species then react with the unwanted deposits to form a volatile by-product that is pumped out of the processing chamber. These cleaning methods are desirable in that they reduce the potential for contamination by removing deposits that may shed particles on the substrate being processed. Furthermore, a more stable processing environment may be realized by removing accumulated materials that may interfere with the control of processing conditions. Direct plasma clean methods, however, have the disadvantage in that plasma generated ions continuously bombard internal surfaces of the processing chamber and can cause damage to associated hardware, such as susceptors, heater blocks, lift pins, gas lines, viewports, showerheads, thermal shields, susceptors, and temperature measuring probes such as optical pyrometers and thermocouples. In addition, direct plasma clean methods may not completely clean peripheral areas of the processing chamber or areas that are difficult to access such as underneath susceptors, places around robotic parts such as lift pins, or within gas distribution showerheads.

In order to overcome these disadvantages, remote plasma clean methods have been developed to avoid many of the problems encountered with direct plasma cleaning. In a Remote Plasma Clean (RPC) process, a plasma is ignited from gases fed into a chamber that is located remotely from the processing chamber. Plasma-activated species from the RPC chamber then flow through a delivery line towards the processing chamber. Because the plasma is generated remotely and in a separate compartment from the processing chamber, there is less opportunity for ion bombardment and plasma radiation to damage hardware within the processing chamber. Once delivered to the processing chamber, the activated species can then react with the unwanted deposits and residues, and the volatile by-products can be removed from the processing chamber.

Although remote plasma cleaning methods alleviate many of the problems encountered with direct plasma cleaning, there are still many challenges to be addressed. One such challenge is the phenomenon of recombination, which occurs when activated species generated in the RPC chamber recombine while flowing to the processing chamber. The activated species may comprise, for example, neutral fluorine radicals, which can recombine into a non-reactive form. Of course, not all the radicals recombine on their way to the processing chamber, but any recombination that does occur lowers the overall efficiency of the remote cleaning process, and requires an increased flow of feed gases to the RPC chamber to make up for the loss of efficiency. This recombination of activated species is undesirable because the cleaning gas is expensive, and disposing of the chemically inactive recombined radicals can be environmentally unfriendly.

One cause of excessive recombination occurs when the gas delivery system exhibits a low gas conductance. A low gas conductance results in higher pressures in the delivery system, which increases the likelihood of a collision between two (rarely more) activated species to form a non-reactive molecule. A low conductance delivery system can also substantially increase the operating pressure within the RPC chamber. This pressure is often referred to as backpressure from the point of view of the RPC chamber, since this is the pressure against which the remote plasma source is forced to deliver activated species. High backpressure in the RPC chamber requires high RF plasma power to generate sufficient plasma-activated species for effective clean rates. This high power consumption results in low cleaning efficiencies and affects the overall cost of performing the clean.

Another problem associated with RPC processes occurs when gases present during substrate processing travel from the processing chamber to the RPC chamber through the delivery system in a reverse direction. This diffusion of process gases into the RPC chamber is undesirable due to the potential for the RPC chamber to become contaminated. Moreover, an open RPC delivery system presents a larger deposition volume (represented by the volume of the delivery line and RPC chamber). This increase in volume may influence and interfere with processing conditions in the processing chamber (e.g., chamber pressure and gas flows) during substrate processing.

Other problems typically encountered with remote plasma cleaning operations involve the difficulty in cleaning various regions of the processing chamber. For example, the plasma-activated species may be unable to reach areas underneath the susceptor, places around robotic parts such as the lift pins used to raise and lower the substrate during substrate transport, and cavities within the showerhead used to supply and distribute process gases to the processing chamber. Furthermore, chambers adjacent to the processing module, such as substrate transfer chambers, vacuum loadlocks, and the isolation doors between them are typically not addressed by conventional RPC processes. Further problems occur when plasma-activated species from the RPC chamber react with materials that comprise the deposition gas delivery system (materials such as stainless steel), thereby causing some of those materials to flow into the processing chamber and contaminate the substrate being processed. Still further problems involve determining the point at which the cleaning process is complete.

Therefore, in light of the deficiencies with conventional approaches, there is a need for systems and methods that can efficiently and effectively clean semiconductor processing chambers using improved remote plasma cleaning techniques.

SUMMARY OF THE INVENTION

Aspects of the present invention provide a Remote Plasma Cleaning (RPC) system for cleaning the interior of a separate processing chamber or reactor. The RPC system may include a RPC chamber coupled to a gas supply and power supply for igniting and sustaining a cleaning plasma within the RPC chamber. The RPC plasma may be generated from a mixture of gases including, but not limited to, $NF_3$ and Ar. A high conductance delivery system couples the RPC chamber to a processing chamber and enables activated species to flow from the RPC chamber to the processing chamber. The activated species are preferably introduced into the processing chamber via a dedicated inlet port, such as an opening formed in a wall of the processing chamber. The inlet port substantially increases the conductance of the RPC delivery system compared to delivering the RPC gas through a conventional showerhead, reducing the backpressure experienced by the RPC chamber. The RPC chamber may also be arranged close to and below the processing chamber to reduce the length (and further increase the conductance) of the RPC delivery system, while allowing unobstructed access to a top portion of the processing chamber. These aspects of the present invention enable the conductance of the delivery system to be greater than about 40 liters per second when measured with a process chamber pressure greater than or equal to 1 Torr, and a RPC feed gas flow rate of about 2,000 sccm. These aspects also allow the power supplied to the RPC chamber to be maintained at a level less than about three kilowatts (3 kW).

Other aspects of the present invention incorporate an isolation valve in the delivery system for selectively isolating the RPC chamber from the processing chamber. For example, the isolation valve may be configured to isolate the RPC chamber during substrate processing in order to prevent the additional volume of the RPC chamber from interfering with processing conditions and to prevent process gases from the processing chamber from contaminating the RPC chamber. The isolation valve may then be opened to allow cleaning gases from the RPC chamber to flow through the delivery system into the processing chamber. A gate valve may also be used as part of a compound valve to protect sensitive components within the isolation valve, such as sealing components, from exposure to activated species when the isolation valve is in an open position. An optical baffle may also be disposed within the output tube of the RPC chamber to further reduce the extent to which sensitive components of the isolation valve are exposed to radiation and ion bombardment emitted from the RPC chamber.

In a first embodiment of the present invention, activated species from the RPC chamber are introduced into the processing chamber via a first and a second inlet port that are preferably spaced apart so as to introduce activated species into different portions of the processing chamber. The inlet ports may be advantageously coupled to the same RPC chamber by, for example, coupling the RPC delivery system to a manifold that supplies each inlet port. For processing chambers having dual processing stations, for example, the inlet ports may be spaced apart such that the first inlet port introduces activated species to a first processing station and the second inlet port introduces activated species to a second processing station. Cleaning gases and volatile by-products from the cleaning process may then be exhausted from the processing chamber via an exhaust port. In this embodiment of the present invention, an exhaust port may be approximately equally spaced between the first and the second inlet ports in order to provide substantially uniform exhaust of volatile by-products from both processing stations. The first embodiment of the present invention may further include flow channels formed in the processing module that enable cleaning gases to flow underneath the susceptor to clean robotic parts, lift pin assemblies and other components and surfaces located underneath the susceptor. Other inlet ports coupled to the processing chamber, such as the showerheads and process gas delivery lines used to supply process gases during substrate processing, may be cleaned by flowing a portion of the cleaning gas through the showerheads and their associated delivery lines.

In a second embodiment of the present invention, activated species are introduced into the processing chamber and volatile by-products are exhausted from the processing chamber via a coaxial inject/exhaust assembly. The coaxial inject/exhaust assembly may include an inner tube coupled to the RPC delivery system for delivering activated species to the processing chamber, and an outer tube coupled to an exhaust system for exhausting gases from the processing chamber. In this embodiment, the coaxial inject/exhaust assembly may be disposed in a central portion of the processing chamber, such as between a first and a second processing station. A plurality of exhaust ports may then be arranged around a peripheral portion of the processing chamber to draw activated species from the central portion toward the peripheral portion to affect cleaning of the interior of the processing chamber. Each exhaust port may also be coupled to a flow channel that directs activated species from the RPC chamber underneath the susceptor and susceptor support toward interior cavities to clean surfaces and components located underneath the susceptor and susceptor support before the activated species (and cleaning reaction by-products) are exhausted via the outer exhaust tube of the coaxial inject/exhaust assembly. These flow channels advantageously allow activated species to clean the underneath portions of the susceptor support, the lift pins and associated robotic parts as the activated species flow through the flow channels toward the coaxial inject/exhaust assembly.

Other embodiments of the present invention enable endpoint detection of a cleaning process to be performed by igniting a second low power (e.g., less than about 800 W) plasma in the process chamber from the activated species of the RPC chamber. Endpoint detection may be performed by monitoring the emission lines of species within the second plasma, and may include further signal processing that involves taking appropriate ratios of those emission lines.

BRIEF DESCRIPTION OF THE DRAWINGS

These and other features and advantages of the present invention will become more apparent to those skilled in the art from the following detailed description in conjunction with the appended drawings in which.

DESCRIPTION

Aspects of the present invention provide systems and methods for cleaning semiconductor processing chambers. The following description is presented to enable a person skilled in the art to make and use the invention. Descriptions of specific applications are provided only as examples. Various modifications, substitutions and variations of the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, and should be accorded the widest scope consistent with the principles and features disclosed herein.

Figure 1:
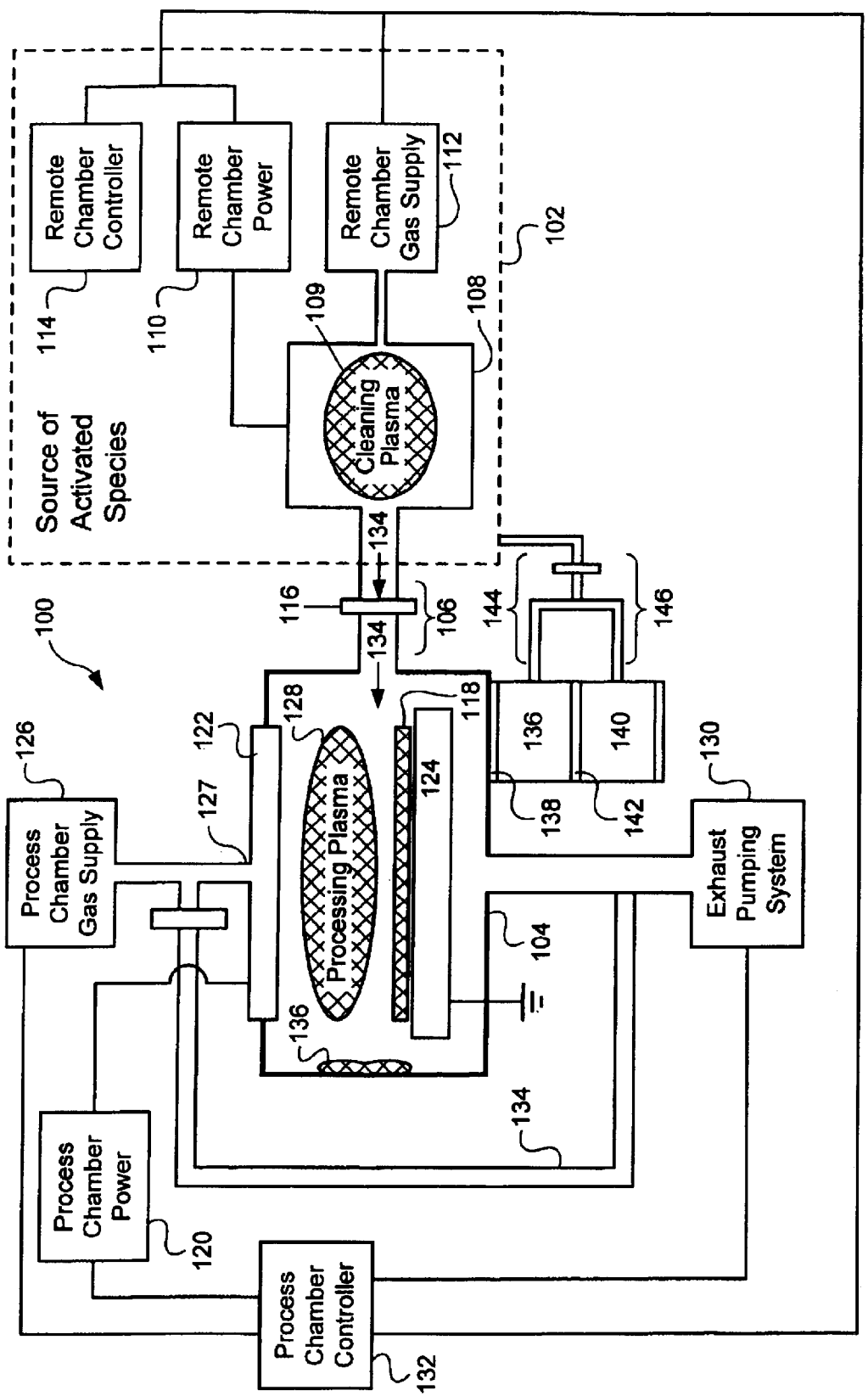
FIG. 1 illustrates an exemplary process module and remote plasma cleaning system in accordance with the principles of the present invention.

Referring to FIG. 1, an exemplary process module and remote plasma cleaning system in accordance with the principles of the present invention is illustrated generally at 100. The exemplary system includes a remote source of activated species 102 coupled to a processing chamber 104 via a delivery system 106. The remote source 102 may include a RPC chamber 108 coupled to a power supply 110 and a gas supply 112. A controller 114 associated with the remote source 102 may be configured to regulate the amount of power coupled to the RPC chamber 108 to ignite and sustain a remote cleaning plasma 109 within the RPC chamber 108. The gases supplied by the gas supply 112 may include a fluorine containing gas mixes in a second gas, such as a mixture of $NF_3$ and argon.

The processing module of FIG. 1 may be advantageously used to perform a plasma enhanced chemical vapor deposition (PECVD) process to deposit a film on a substrate 118. For this exemplary process, the processing chamber 104 may comprise a parallel plate plasma reactor, where a power supply 120 associated with the processing chamber 104 is electrically connected to the upper electrode 122. The lower electrode 124 is heated and electrically grounded, serves as a support for the substrate 118 during processing, and is typically called a susceptor. The upper electrode may be used to couple power to gases from the gas supply 126 to ignite and sustain a processing plasma 128. Process gases may be introduced into the processing chamber 104 via a gas inlet port 127, such as a conventional showerhead, and exhaust gases may be removed from the processing chamber 104 using an exhaust system 130. A controller 132 associated with the processing chamber 104 regulates the gas and power supplied to the processing chamber 104, and adjusts the pressure in the chamber 104 by controlling the pumping speed of the exhaust system 130, and the flow of process gas from the gas supply 126.

In operation, a substrate 118 to be processed is placed in the processing chamber 104. Process gases from the gas supply 126 are then introduced into the processing chamber 104 via the gas delivery line 127, and the power supply 120 supplies power to the upper electrode 122 to ignite and sustain a processing plasma 128. When processing of the substrate 118 is complete, the processing plasma 128 is extinguished and the substrate 118 is removed from the processing chamber 104. Activated species 134 from the RPC chamber 108 may be then introduced into the processing chamber 104 via a dedicated port 132, such as an opening formed in a side wall of the processing chamber 104, to clean the interior of the processing chamber 104. Once introduced, the activated species react within the processing chamber 104 to remove unwanted deposits, residues and films 136 from the surfaces of hardware and chamber walls. The activated cleaning gases and volatile by-products of the cleaning process may then be exhausted from the processing chamber 104 using the exhaust pump 130.

Aspects of the present invention overcome many of the problems commonly associated with remote plasma cleaning processes. For example, by providing a high conductance RPC delivery system 106 between the RPC chamber 108 and the processing chamber 104, the backpressure experienced by the RPC chamber 108 can be substantially reduced. A lower backpressure provides a number of advantages. These advantages include reducing the potential for gas phase recombination and thereby increasing the transport efficiency of activated species to the process chamber. Increased transport efficiency enables the use of lower flows of fluorine containing cleaning gases supplied to the RPC chamber 108 from the remote chamber gas supply 112. Cleaning gases such as $NF_3$ are expensive; often times in short supply, and the activated products can be environmentally hazardous. Lower backpressure also enables the RPC chamber 108 to operate at a lower power level with negligible loss in process chamber clean rate.

As will be described in greater detail below, these aspects of the present invention enable the conductance of the delivery line to be greater than about 40 liters per second when the conductance is measured with the processing chamber at a pressure of about 1 Torr, and when the RPC feed gas flow rate is about 2,000 standard cubic centimeters per minute (sccm). It is typically necessary to state the conditions under which conductance is measured, most important of which are pressure and flow, but temperature also to some extent, in order to rationally compare conductance measurements. Since the conductance of a RPC delivery system is a function of the average pressure within the RPC delivery system, the flow of the gas in the system (which in turn is dependent on the geometry of the components), and the temperature of the gas, conductance numbers should be compared when measured under similar conditions. Therefore, if the conductance of a RPC delivery system of a remote plasma clean apparatus is measured when the processing chamber pressure is about 1 Torr and the gas flow rate is about 2,000 sccm, the conductance according to embodiments of the present invention will be at least about 40 liters per second.

A consequence of designing a RPC delivery system to have a conductance of at least 40 liters per second (when measured according to the above specified conditions such that a comparison of conductance numbers is fair) is that it allows the power supplied to the RPC chamber 108 by the source 110 to be maintained at a level less than about three kilowatts (3 kW).

Furthermore, introducing activated species from the RPC chamber 108 through a RPC delivery system 106, and then into the processing chamber 104 through dedicated port 132 (rather than through a process gas showerhead 127 and associated process gas supply line) may reduce the potential for contamination of the processing chamber 104. Because process gas supply lines typically include stainless steel components that may react with activated species, using a dedicated inlet port 132 and RPC delivery system 106 made of less reactive materials, such as aluminum, may substantially reduce the potential for contamination relative to a stainless steel source (a particularly undesirable form of contamination in semiconductor substrate processing).

It should be noted that the embodiment of FIG. 1 may also incorporate an isolation valve 116 within the RPC delivery system 106 for selectively closing off the RPC chamber 108 from the processing chamber 104. When the processing chamber 104 is being used to process a semiconductor substrate 118, for example, the isolation valve 116 may be closed to isolate the RPC chamber 108 from the processing chamber 104. Once substrate processing is complete and the substrate has been removed, the isolation valve 116 may be opened to allow activated species to flow from the RPC chamber 108 to the processing chamber 104 to affect cleaning of the processing chamber 104. By isolating the RPC chamber 108 from the processing chamber 104, the processing chamber 104 can perform substrate processing without adverse influence from the extra volume of the RPC chamber 108 and the potential for contamination of the RPC chamber 108 with process gases can be reduced. The isolation valve 116 may also be closed during periods when the processing chamber 104 is open to atmospheric conditions for maintenance in order to avoid undesirable seasoning effects caused by exposure of the RPC chamber 108 to moisture. In addition, the isolation valve also enables maintenance to be performed on the RPC chamber while maintaining process chamber vacuum integrity. The RPC delivery system 106 may also include a gate valve and an optical baffle for protecting sensitive components of the isolation valve 116, such as sealing members, from exposure to activated species and plasma radiation from the RPC chamber 108.

In another embodiment of the present invention, the upper portions of the processing chamber 104, which may be a showerhead for distributing process gases, and an upper electrode 122, may be cleaned by connecting the exhaust system 130 to the process gas inlet port 127. This allows activated species from the RPC chamber 108 to be drawn out of the processing chamber 104 through the process gas inlet port 127, along exhaust line 134, ultimately to be pumped away by the exhaust system 130.

In another embodiment of the present invention, auxiliary chambers that are used to service the processing chamber 104 may be cleaned in at least one of two ways. Referring again to FIG. 1, a substrate transfer chamber 136 is positioned adjacent to the processing chamber 104, and is separated therefrom by a door 138. A vacuum loadlock 140 is positioned adjacent to the transfer chamber 136, and the loadlock 140 is separated from the transfer chamber 136 by a door 142. During a typical process, substrates are loaded from the outside environment into the loadlock 140. The substrate transfer chamber 136 houses a transfer robot (not shown) for transferring substrates from the loadlock 140 into the processing chamber 104. Of course, there may be a plurality of processing modules connected to the transfer chamber 136, as embodied in a so-called cluster tool.

To clean the transfer chamber 136, the door 138 may be opened to allow activated species from the RPC chamber 108 to flow into the processing chamber 104 and thence into the transfer chamber 136 for cleaning. Alternatively, activated species may flow directly from the RPC chamber 108 through a RPC delivery system 144 into the transfer chamber 136. To clean the loadlock 140, the door 142 may be opened to allow activated species to flow from the transfer chamber 136 into the loadlock 140. Alternatively, a RPC delivery system 146 may be used to transport activated species directly from the RPC chamber 108 to the loadlock 140.

Figure 2:
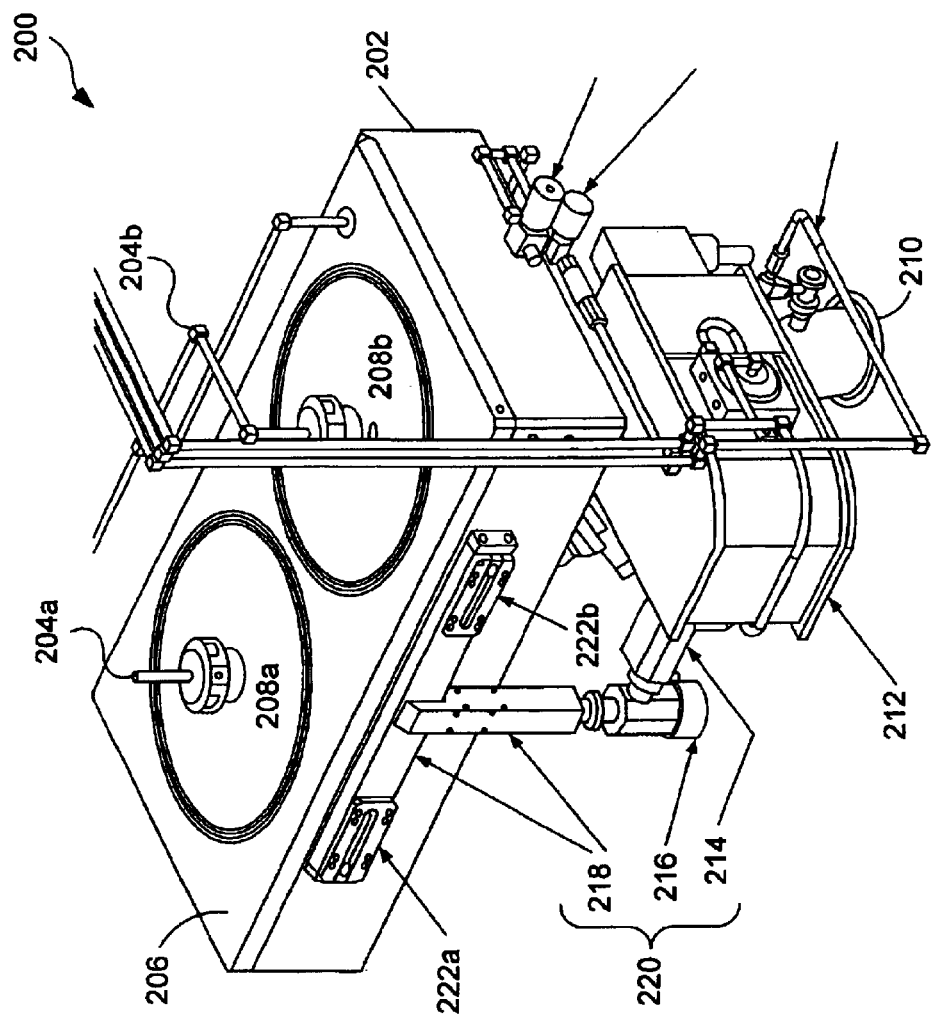
FIG. 2 illustrates a three-dimensional view of an exemplary process module and remote plasma cleaning system in accordance with a first embodiment of the present invention.

Referring to FIG. 2, a three-dimensional view of an exemplary process module and remote plasma cleaning system in accordance with a first embodiment of the present invention is illustrated generally at 200. The exemplary system of FIG. 2 is shown without the accompanying hardware that may be used to transport substrates into and out of the processing chamber. Furthermore, there may be several such processing chambers attached to a single substrate transfer chamber that incorporates the appropriate transfer hardware. An exemplary transport system is described in U.S. patent application Ser. No. 09/200,660, filed Nov. 25, 1998, which has been assigned of record to the assignee of the present application and is incorporated herein by reference.

Referring again to FIG. 2, the exemplary system includes a processing chamber 202 which may be configured to deposit a thin film onto a semiconductor substrate using plasma enhanced chemical vapor deposition (PECVD) techniques. The process chamber 202 includes a process gas delivery system (the terminal portions of which are illustrated at reference numerals 204a and 204b) connected to a top lid 206 of the processing chamber 202. The processing chamber 202 is configured to process two substrates simultaneously, using two adjacent processing stations 208a and 208b. A common exhaust system 210 at a bottom portion of the processing chamber 202 exhausts process gases and activated species from the processing chamber 202, and maintains a desired pressure within the processing chamber 202 through the use of exhaust pumps, gate valves, exhaust lines and the like.

The remote plasma cleaning portion of the exemplary system includes a RPC chamber 212, an output tube 214, an isolation valve 216 and a distribution manifold 218. The output tube 214, isolation valve 216 and distribution manifold 218 may comprise a part of a RPC delivery system 220 that transports activated species from the remote plasma generator 212 to the processing chamber 202. In the first embodiment of the present invention, activated species are introduced into the processing chamber 202 via inlet ports 222a, 222b disposed on a side portion of the processing chamber 202. Preferably, the inlet ports 222a, 222b are spatially separated from one another so as to introduce activated species to different portions of the processing chamber 202, such as to respective processing stations 208a and 208b. The inlet ports 222a, 222b may be reserved specifically for delivering cleaning gases, or they may serve additional functions, such as providing a viewport for observing the interior of the processing chamber 202.

Figure 3:
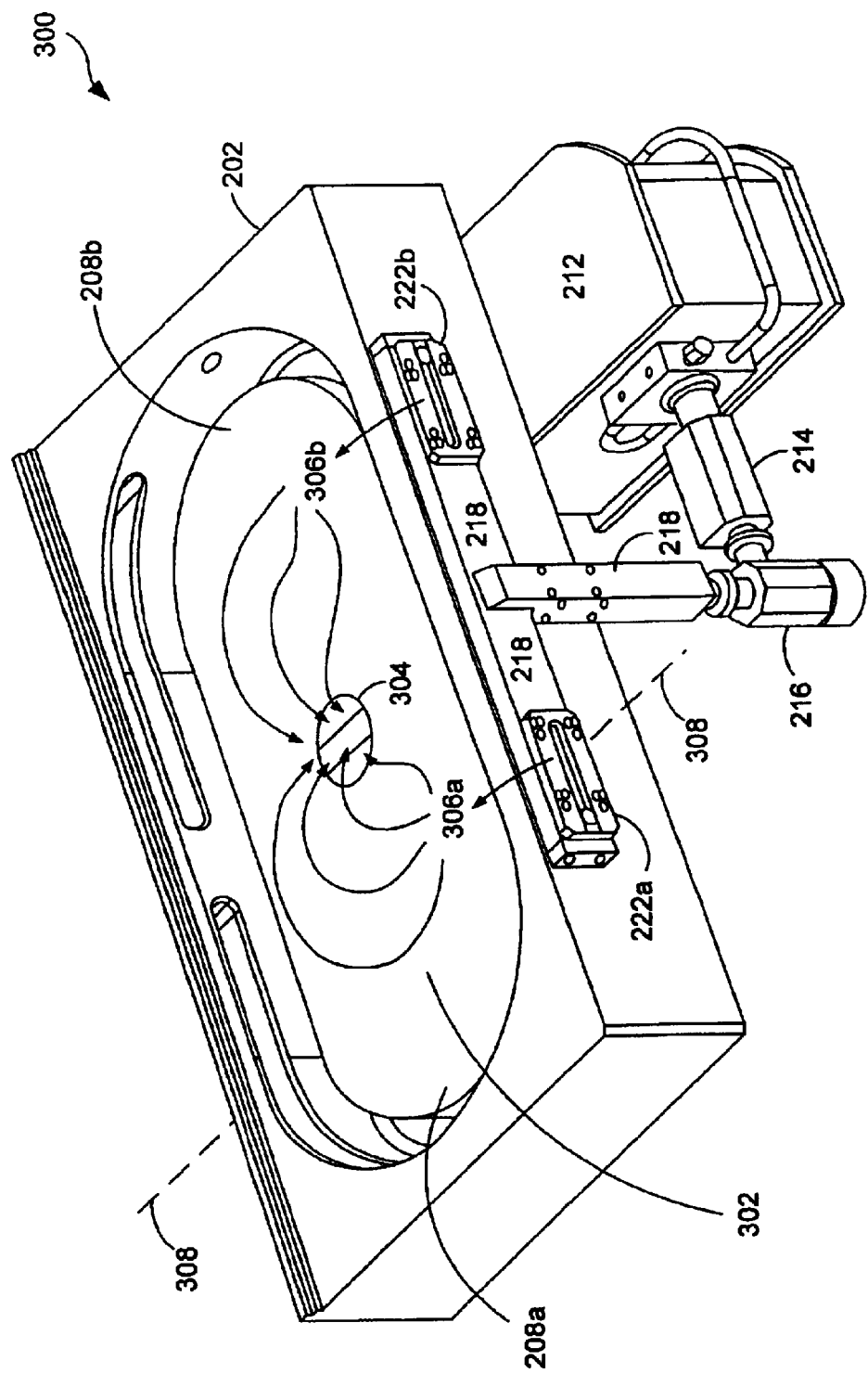
FIG. 3 illustrates the exemplary process module and remote plasma cleaning system of FIG. 2 with the top plate of the process module removed.

FIG. 3 illustrates the exemplary process module and remote plasma cleaning system of FIG. 2 with the top plate 206 of the processing chamber 202 removed. The remote plasma generator 212 is configured to generate and sustain a cleaning plasma such that activated species flow through the output tube 214, isolation valve 216 and distribution manifold 218. The distribution manifold 218 directs the activated species vertically upward and then horizontally in laterally opposed directions toward the inlet ports 222a, 222b. Once introduced into the processing chamber 202, the activated species flow generally along pathways 306a and 306b toward a centrally located exhaust port 304 formed in the susceptor 302. Although not illustrated in FIG. 3, the exhaust port 304 extends through the susceptor 302 and is coupled to the exhaust line 210 for exhausting gases from the processing chamber 202.

The RPC delivery system 220 coupled between the remote plasma generator 212 and the processing chamber 202 is preferably configured to have a high conductance in order to reduce the backpressure experienced by the remote plasma generator 212. This objective is achieved by making the length of the RPC delivery system 220 as short as possible, and the diameters of the components of the RPC delivery system 220 as large as practical. In some exemplary embodiments, for example, the inside diameter of the output tube 214, isolation valve 216 and distribution manifold 218 range from about 0.5 to 2 inches, and the length of the RPC delivery system 220 ranges from about 10 to 20 inches. With such a configuration the conductance of the RPC delivery system may be at least 40 liters per second, remembering that conductance is a function of pressure, gas flow, and temperature, and that in order to make a meaningful comparison the 40 liters per second number refers to a measurement taken at a processing chamber pressure of about 1 Torr, RPC delivery system flow of activated species of about 2,000 sccm, and temperature of activated species in the RPC delivery system of about room temperature.

It should be noted that the placement of the RPC chamber 212 relative to the processing chamber 202 may influence the length (and therefore the conductance) of the RPC delivery system 220. Accordingly, in order to reduce the length of the RPC delivery system 220 the RPC chamber 212 may be positioned below and possibly to one side of the processing chamber 202. In addition to increasing the conductance of the RPC delivery system 220 (by decreasing its length), positioning the RPC chamber 212 close to the processing chamber 202 in the manner described has other advantages. One advantage is that access to the interior of the processing chamber 202, which may be necessary for routine maintenance of the chamber, is facilitated by providing relatively unobstructed movement of the top lid 206. A second advantage is that the length of the RPC delivery system 220 may be reduced relative to other placements of the remote plasma generator 212, which reduces both the distance that activated species must travel and the opportunity for activated species to recombine along the way.

RPC delivery systems according to exemplary embodiments of the present invention also exhibit reduced backpressures, which in turn reduce the pressure in the RPC chamber 212. Because the power required to ignite and sustain a plasma in the RPC chamber 212 is a function of the pressure of the gas from which the plasma is generated, lowering the pressure within the RPC chamber 212 reduces the power required to sustain the plasma. In some embodiments of the present invention, a pressure of about 1.5 Torr is sustained within the RPC chamber 212, and a pressure of about 1.0 Torr is maintained within the processing chamber 202, where the total gas flow is 2,000 sccm. Thus, in this example, there is a pressure differential of about 0.5 Torr from one end of the RPC delivery system 220 to the other. This is a substantially smaller pressure differential than would be realized had the cleaning gas been supplied to the processing chamber 202 through a conventional showerhead. Using these aspects of the present invention, the power required by the remote plasma generator 212 will be less than about 3 kW.

Figure 4:
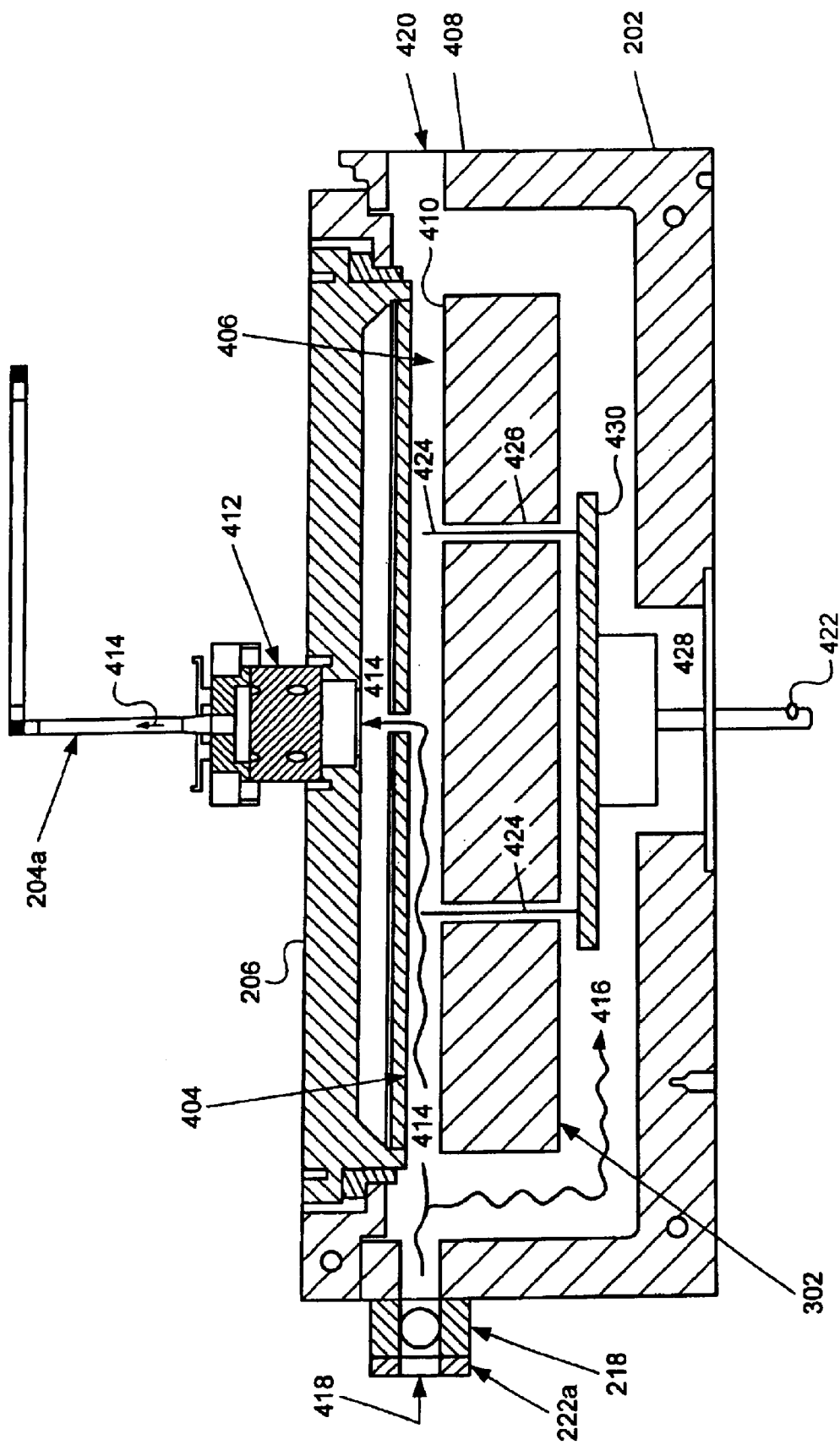
FIG. 4 illustrates a cross-sectional view of the exemplary process module and remote cleaning system of FIG. 2 through a plane containing an inlet port.

In addition to cleaning the interior surfaces of the processing chamber 202, aspects of the present invention also enable the remote plasma system to clean surfaces and associated components located underneath the susceptor, other cavities, and supply lines used to supply process gases to the processing chamber. FIG. 4, for example, illustrates a cross-sectional view of the exemplary process module and remote cleaning system of FIG. 2 in a plane defined by line 308 in FIG. 3. In this embodiment, the processing chamber 202 includes a showerhead 404 and associated gas supply lines 204a for supplying process gases to the processing chamber 202. During processing, process gases flow through the gas supply line 204a into a plenum and are distributed within the processing chamber 202 by the showerhead 404. Because the showerhead 404 may be electrically powered, the showerhead may be electrically isolated from the top lid 206 by an insulator 412, which may be fabricated from a material such as $Al_2O_3$, quartz, or some other ceramic. The processing chamber of FIG. 4 also includes a slit door 420 disposed in a side portion of the processing chamber 202 for enabling substrates to be inserted into and retrieved from the processing chamber 202. A lift pin assembly 422 is used to lower the substrate toward the surface 410 of the susceptor 301 and raise the substrate off the surface 410 to enable insertion and retrieval by robotic components.

During remote plasma cleaning, activated species flow into processing chamber 202 via the distribution manifold 218 and inlet port 222a (which may incorporate a view port 418 for enabling operators to view the interior of the processing chamber 202). Notably, the processing chamber 202 includes channels that enable cleaning gases to flow underneath the susceptor 302 as indicated generally by reference numeral 416. These flow channels enable a portion of the activated species to flow and clean remote cavities and robotic components located underneath the susceptor 302, such as the lift pin assembly 422 and lift pins 424.

Because activated species are not delivered through a conventional showerhead, the plasma-activated cleaning gas can diffuse through the showerhead orifices located in 404 and into the showerhead cavity located between the top lid 206 and the showerhead 404 and shown by reference numeral 414. This gas diffusion can be enhanced by periodically reversing the gas flow through 204a to enable cleaning gases to flow through the showerhead 404 and supply lines 204a in a reverse direction as depicted generally by reference numeral 414. This diffusion and/or reversal of gas flow enable the activated species to clean the holes formed in the showerhead, the plenum above the showerhead 404 and the interior surfaces of the supply lines 204a. Furthermore, because the activated species (and potential metal contaminants generated from the reaction of activated species with the interior walls of the supply line) flow in a reverse direction through the showerhead 404 and supply line 204a, the introduction of metal contaminants into the processing cavity 406 may be avoided.

Figure 5:
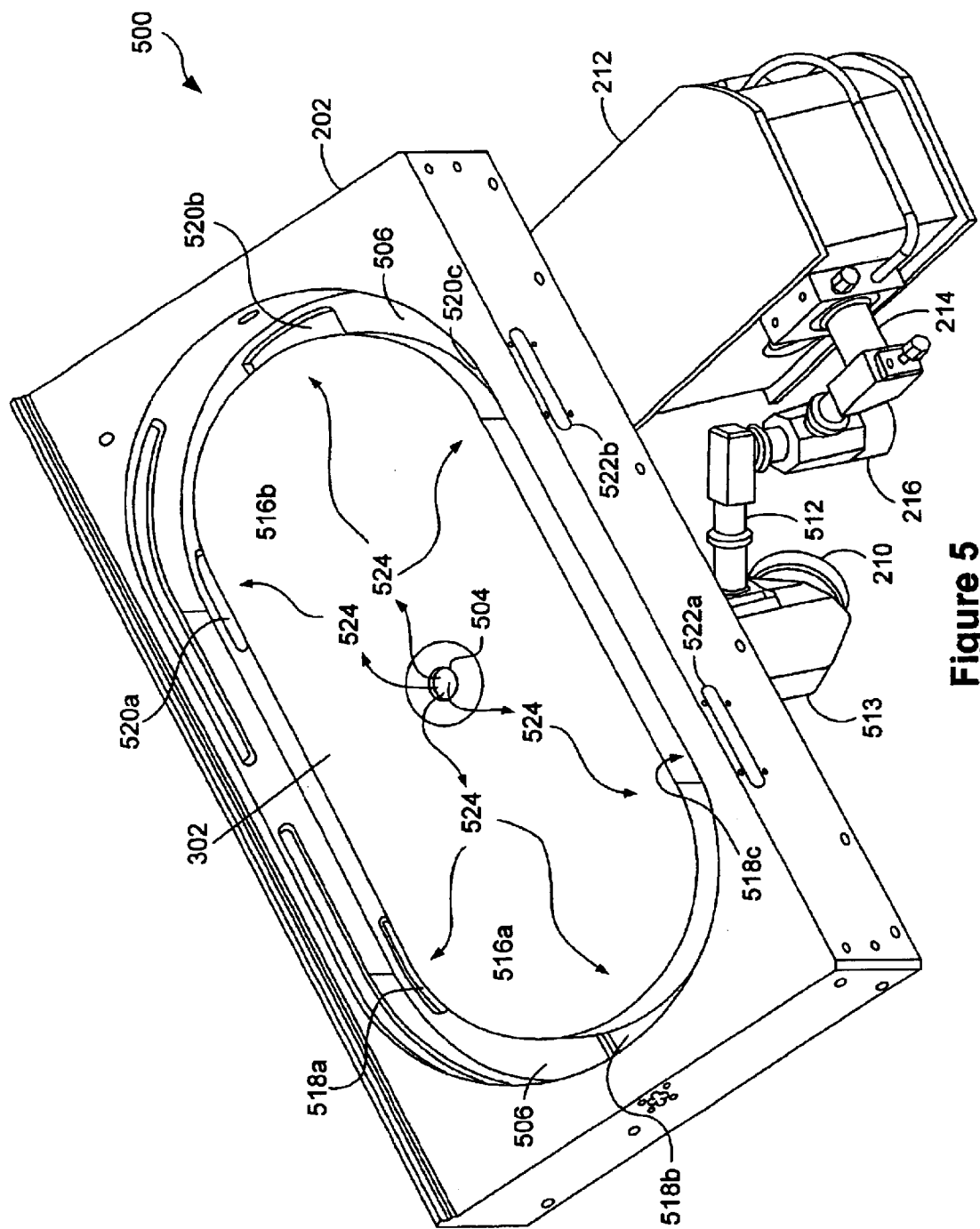
FIG. 5 illustrates a three-dimensional view of an exemplary process module and remote plasma cleaning system in accordance with a second embodiment of the present invention.

Referring to FIG. 5, a three-dimensional view of an exemplary process module and remote plasma cleaning system in accordance with a second embodiment of the present invention is illustrated generally at 500. For convenience, the exemplary process module is illustrated with the top lid (and associated components) removed to allow a view of the interior of the processing chamber 202. It should be noted that the second embodiment of present invention incorporates many of the same principles described above with respect to the embodiments of FIGS. 1 and 2, such as placement of the remote plasma generator, conductance of the delivery line, materials from which the delivery line may be fabricated, etc. Accordingly, the following description is intended to provide additional features of the present invention that may be utilized in connection with the foregoing embodiments.

As illustrated in FIG. 5, the exemplary system includes a remote plasma generator 212 that delivers activated species (shown as 524) to the processing chamber 202 via an output tube 214, isolation valve 216 and distribution tube 512. During cleaning, activated species flow from the remote plasma generator 212, through the output tube 214 and isolation valve 216 to the distribution tube 512. The distribution tube 512 then directs the activated species upward through a coaxial inject/exhaust assembly 513 and introduces the activated species into the processing chamber 202 via an inlet port 504. In this exemplary embodiment, the inlet port 504 may be centrally located within the processing chamber 202. A plurality of exhaust ports 518, 520 formed in a susceptor support plate 506 may be arranged around a peripheral portion of the processing chamber 202 in order to draw cleaning gases from the central portion of the processing chamber 202 to the peripheral portion. Preferably, the exhaust ports 518, 520 are spaced apart so as to provide a substantially even distribution of activated species across the interior surfaces of the processing chamber 202. For example, the exhaust ports 518, 520 may be arranged so that three exhaust ports 518a, 518b, 518c are associated with a first processing station 516a and another three exhaust ports 520a, 520b, 520c are associated with a second processing station 516b. In this embodiment, viewports 522a and 522b may be disposed in a side portion of the processing chamber for enabling operators to view the interior of the processing chamber 202.

It should be noted that other embodiments of the present invention may incorporate alternative arrangements of the exhaust ports 518, 520. For example, the processing chamber 202 may include only two laterally opposed exhaust ports, such as exhaust ports 518b and 520b. Alternatively, there may be between four and twelve or more exhaust ports arranged around the processing chamber 202. Furthermore, it is not a requirement that any one exhaust port have the same size or shape as the others, or that the exhaust ports be isolated or discrete exhaust ports. In one exemplary embodiment, for example, there may be a continuous slit formed in the support plate 906 around the periphery of processing chamber 202 to exhaust gases.

Figure 6:
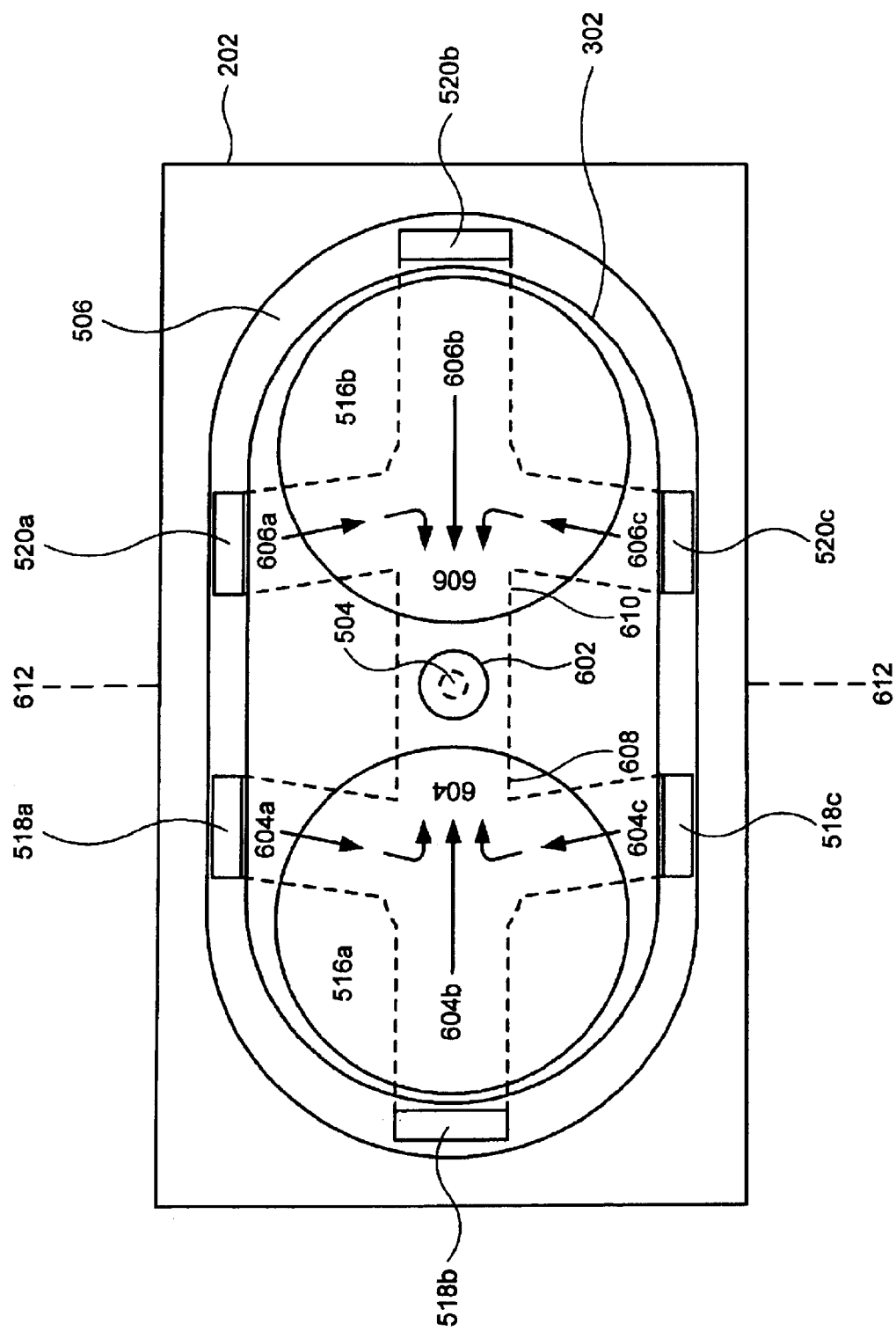
FIG. 6 illustrates a top, plan view of the exemplary process module of FIG. 5 showing flow channels disposed within a susceptor support plate positioned beneath the susceptor.

In addition to cleaning the interior portions of the processing chamber 202, the second embodiment of the present invention also enables the cleaning of surfaces, components, and other difficult to reach areas located beneath the susceptor 302. FIG. 6 illustrates a top, plan view of the exemplary system of FIG. 5 showing flow channels disposed beneath the susceptor 302 within a susceptor support plate to be described subsequently. As illustrated, the processing chamber 202 includes a first set of flow channels that extend radially from a central portion of each processing station 516a, 516b toward respective exhaust ports 518, 520 at approximately 120 degrees with respect to one another. The distal portions of these flow channels are then coupled to a respective exhaust port. Another flow channel extends radially from the central portions of each processing station 516a, 516b toward a central portion of the processing chamber 202 to connect the first set of flow channels with the outer exhaust tube 602 of the coaxial inject/exhaust assembly 513. The flow channel around the outer exhaust tube 602 may include additional portions 604, 606 that widen and increase the conductance of the flow channel to enable a more efficient flow of activated species into the outer exhaust tube 602.

In operation, activated species are introduced into the processing chamber 202 via the inlet port 504 of the coaxial inject/exhaust assembly 513. After being pumped into the exhaust ports 518, 520, the activated species flow radially inward toward the central portions of each processing station 516a, 516b as depicted generally by reference numerals 604 and 606. As the activated species reach the central portions of each processing station 516a, 516b, the gas flows 604, 606 combine and pass over the lift pin assembly, lift pins and other components located underneath the susceptor 302 to clean unwanted deposits and residues formed thereon. After entering the central portion of each processing station 516a, 516b, the activated species then flow toward the central portion of the processing chamber 202, where the activated species are exhausted from the processing chamber 202 via the outer exhaust tube 602.

Figure 7:
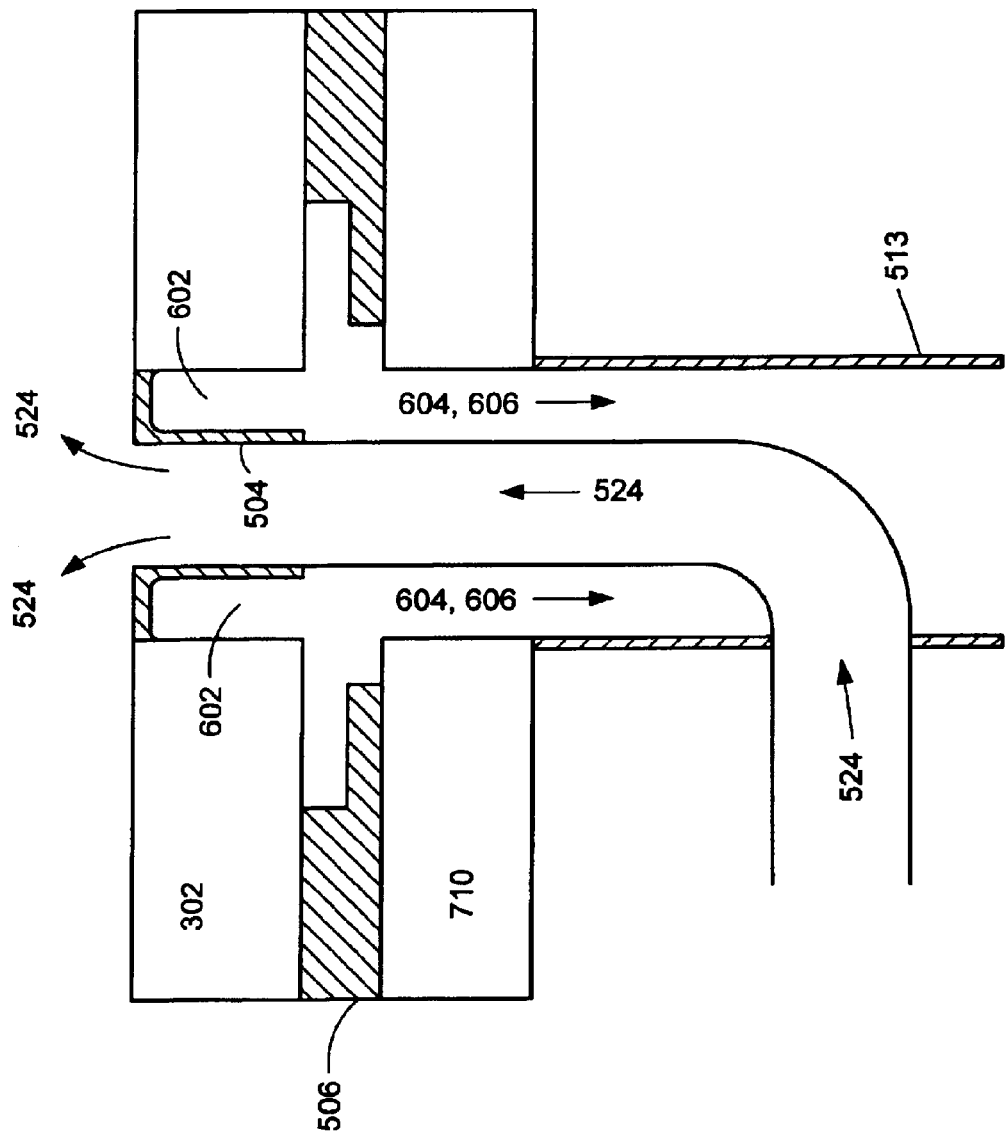
FIG. 7 illustrates a cross-sectional view of an exemplary coaxial gas inject/exhaust tube assembly according to aspects of the present invention.

One aspect of the second embodiment is the ability to inject and exhaust activated species via a coaxial inject/exhaust assembly 513. FIG. 7 illustrates a cross-sectional view of the coaxial gas inject/exhaust assembly 513 in a plane defined by line 612 of FIG. 6. As illustrated, the inject/exhaust assembly 513 comprises an inner tube for transporting activated species that is concentrically surrounded by an outer tube for carrying exhaust gases. The two flows are countercurrent to one another such that the activated species flow in a direction opposite to the exhaust gases. The inner tube extends upward through the outer chamber wall 710, susceptor plate 506 and susceptor 302 to introduce activated species into the processing chamber via the inlet port 504. The outer tube 602 is coupled to an exhaust pump that pumps gases received from the flow channels formed in the susceptor plate 506. It should be noted that although the flow channels and exhaust ports are illustrated as being formed in the susceptor support plate 506, these features may be formed in other portions of the processing chamber 202, such as the susceptor 302 or chamber walls 710. Providing these features within the susceptor support plate 506, however, may be advantageous for maintaining the thermal and mechanical integrity of the susceptor 302 and chamber walls 710.

Other embodiments of the present invention incorporate an optical baffle within the output tube 214 coupled to the remote plasma generator in order to protect delicate components exposed to the degradative remote plasma such as the isolation valve 116 downstream from the RPC chamber. This degradative environment may include, for example, exposure to reactive species, such as free radicals, physical sputtering resulting from high energy ion bombardment, thermal damage that often accompany the high temperature of the remote plasma, and UV degradation from photons produced in the RPC chamber 212. Incorporating an optical baffle in the output tube in accordance with the principles of the present invention may mitigate the damage associated with the thermal, UV, and ion components.

Figure 8:
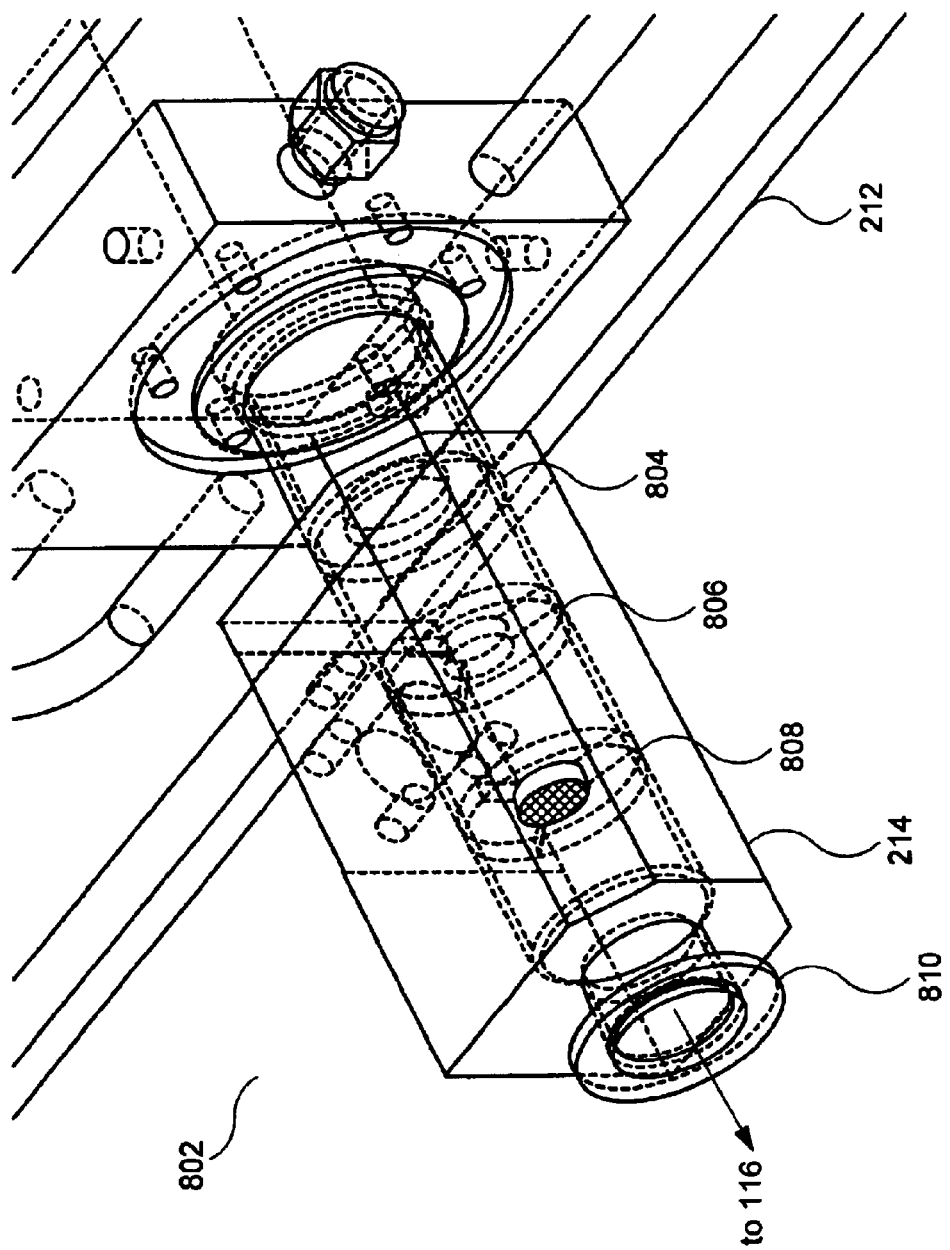
FIG. 8 illustrates an exemplary optical baffle (or radiation shield) that may be disposed within the output tube of a remote plasma generator according to aspects of the present invention.

FIG. 8 illustrates an exemplary optical baffle (or radiation shield) that may be disposed within the output tube according to aspects of the present embodiment. The exemplary optical baffle mitigates many of the problems discussed above by preventing a direct line-of-sight from the RPC chamber 212 to the isolation valve 216. Blocking direct line-of-sight avoids ion bombardment of isolation valve components 216, and reduces the elevated temperatures experienced by components downstream of the optical baffle. It has been found, for example, that positioning an optical baffle in the output tube 214, according to aspects of the present invention, reduces the temperature of parts inside the isolation valve 216 by about 30 degrees Celsius. Furthermore, because polymers (such as a perfluoroelastomer) tend to crosslink, harden, and crack due to exposure to ultraviolet light, the exemplary optical baffle of the present invention may reduce the failure rate of polymers components by reducing direct exposure to ultraviolet radiation emanating from the remote plasma source.

Referring again to FIG. 8, the output tube 214 coupled to the RPC chamber 212 may be configured to include an optical baffle depicted generally at 802. As illustrated, the exemplary optical baffle 802 may comprise three plasma blocking elements 804, 806, and 808 which results in a substantially complete (which in many embodiments is 100% complete) optically opaque baffle with essentially no measurable impact on the conductance of the RPC delivery system. Of course, in alternative embodiments, there may be more than three blocking elements, as well as less than three blocking elements. In one alternative embodiment, for example, the number of blocking elements may range from 1 to 10 or more. The optical baffle 802 may be coupled between the RPC chamber 212 and a flange member 810 that couples the output tube 214 to the input of the isolation valve 116. The blocking portions of the plasma blocking elements 804, 806, and 808 that are responsible for preventing a direct line-of-sight between the remote plasma generator 212 and the compound valve may take on a variety of configurations, including disk shapes and annular shapes. In the embodiment of FIG. 8, for example, the first two blocking elements 804 and 806 have annular shaped blocking portions, whereas the third blocking element 808 has a disk shaped blocking portion.

Figure 9:
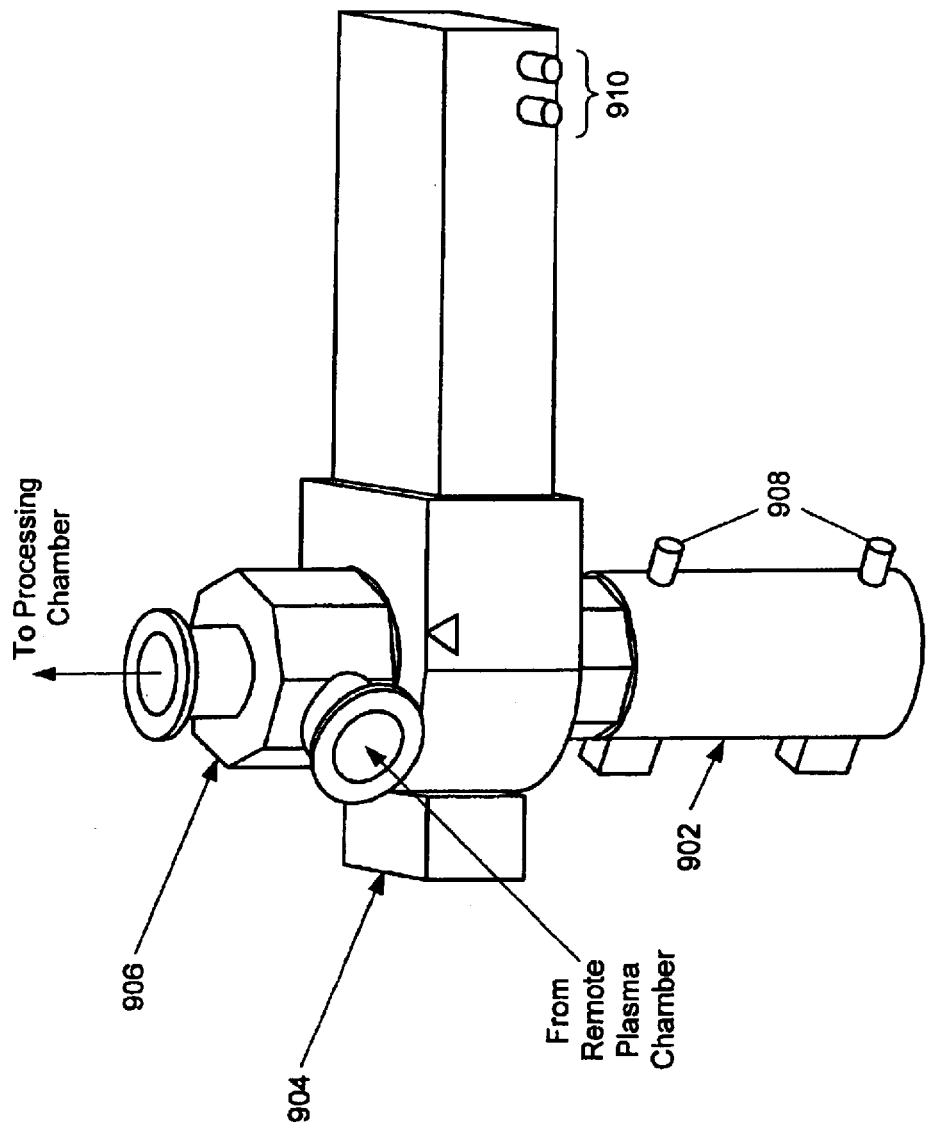
FIG. 9 illustrates a perspective view of an exemplary isolation valve that may be used in accordance with embodiments of the present invention.

As mentioned above, the RPC delivery system between the remote plasma generator and the processing chamber may incorporate an isolation valve for isolating the RPC chamber from the processing chamber during substrate processing and routine maintenance of the processing chamber. FIG. 9 illustrates an exemplary compound valve that may be used by embodiments of the present invention. The exemplary compound valve may comprise an isolation valve 902 for isolating the RPC chamber from the processing chamber, and a gate valve 904 for protecting the sensitive parts of the isolation valve 902 from the degradative species in the remote plasma. The isolation valve 902 may be actuated with air pressure through connections 908, and the gate valve 904 may also be air-actuated using connections 910. By actuating the isolation valve 902 to selectively close the passageway through the body 906 of the compound valve, the RPC chamber can be selectively isolated from the processing chamber.

Figure 10A:
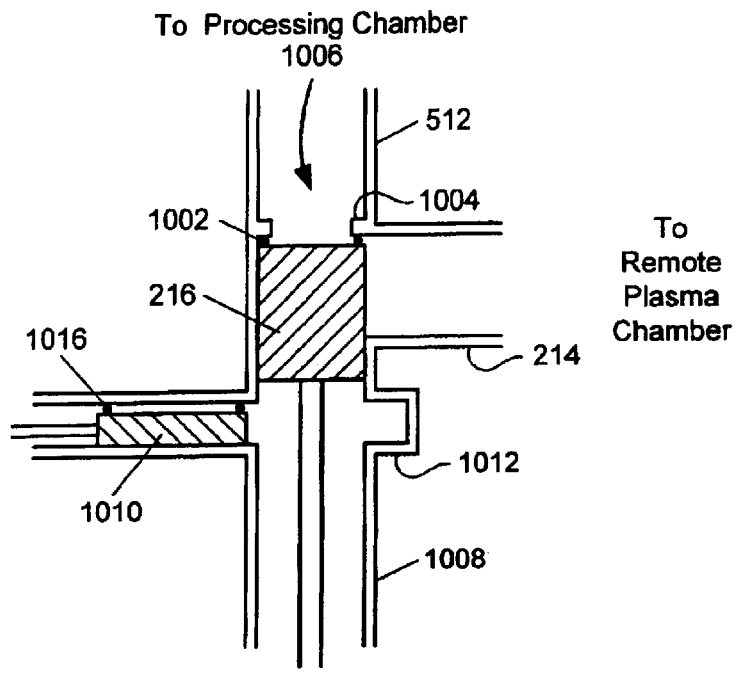
FIGS. 10A and 10B illustrate cross-sectional views of the exemplary isolation valve in a closed position and an open position, respectively.
Figure 10B:
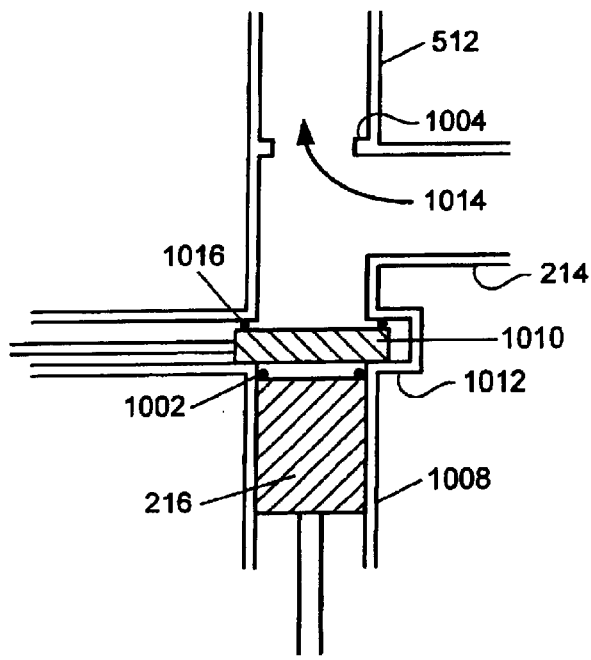

FIGS. 10A and 10B illustrate cross-sectional views of the exemplary compound valve in a closed position and an open position, respectively. FIG. 10A shows the state of a compound valve when the isolation valve 216 is closed, thereby isolating the processing chamber from the RPC chamber. The compound valve may assume this configuration during a processing step or during maintenance of the processing chamber. In this configuration, an o-ring 1002 of the isolation valve 216 rests against a seat 1004 for sealing the output tube 214 from the connecting tube 512. FIG. 10A also depicts the manner in which the isolation valve 216 prevents unwanted species 1006 from flowing from the processing chamber to the RPC chamber during processing.

Upon completion of substrate processing, the compound valve may be opened for cleaning of the processing chamber. For this to occur, the isolation valve 216 is retracted into a housing 1008, and a gate valve 1010 is extended in one direction into a recess 1012, and then moved in a perpendicular direction toward the output tube 214. Retracting the isolation valve 216 into the housing 1012 allows activated species 1014, such as atomic fluorine, to travel from the RPC chamber into the processing chamber through the output tube 214 and then the connecting tube 512. Furthermore, the o-ring sealing member 1002 of the isolation valve 216 is protected from exposure to activated species 1014 and plasma radiation by the gate valve 1010. The o-ring 1016 on the gate valve 1010 is fully compressed and fully protected during remote plasma exposure. In this configuration, only metal parts, which may comprise aluminum, are in contact with the activated species 1014.

Figure 11:
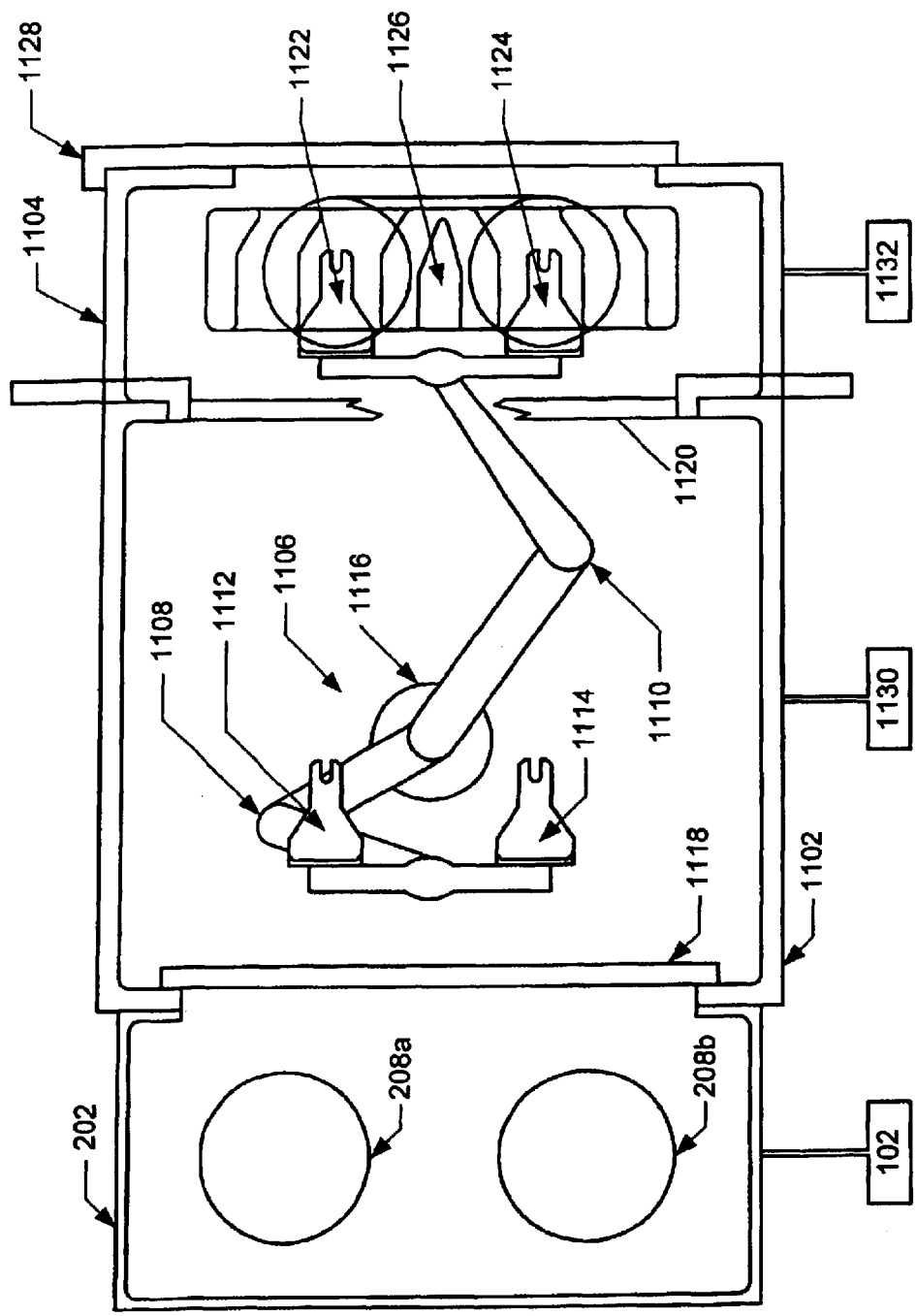
FIG. 11 illustrates a top plan view of an exemplary substrate transport chamber, substrate vacuum loadlock and auxiliary chambers that may also be cleaned by the remote plasma cleaning system of the present invention.

In other exemplary embodiments, the RPC chamber may be used to clean auxiliary chambers associated with the processing chamber, such as a substrate transfer chamber and loadlock as shown in FIG. 11. In many so-called cluster tools, a substrate transfer chamber 1102 is positioned to feed substrates to one or more processing chambers 202. A loadlock 1104 serves to accept substrates from the outside environment without having to break the vacuum integrity of the substrate transfer chamber 1102. To efficiently service a processing chamber 202 having dual processing stations 208a, 208b, a transport robot 1106 having dual arms 1108, 1110 and support paddles 1112, 1114 may be used. The paddles 1112 and 1114 of arm 1108, and paddles 1122 and 1124 of arm 1110, respectively, may be extended toward (and retracted from) the process chamber 202 (as well as the loadlock 1104) for transporting substrates between the loadlock 1104 and the processing chamber 202, and vice versa. A rotating shaft 1116 rotates to allow access to the two chambers 202, 1104. A slit door 1118 is positioned between the transfer chamber 1102 and the processing chamber 202 for isolating the two chambers during processing.

According to aspects of the present invention, the slit door 1118 may be opened to flow activated species from the processing chamber 202 into the transfer chamber 1102 to clean the interior surfaces of the transfer chamber 1102 and transport robot 1106. Likewise, the door 1120 between the loadlock 1104 and the transfer chamber 1102 may be opened to flow the activated species from the transfer chamber 1102 to the loadlock 1104 to clean hardware within the loadlock 1104. This hardware may include, for example, storage shelves 1126, and the inside of door 1128 through which substrates are transferred to and from atmospheric loading stations.

Alternative embodiments include direct transportation of activated species from one or more RPC chambers to the transfer chamber 1102 and loadlock 1104, thus bypassing the process chamber 202. As illustrated in FIG. 11, the transport chamber 1102 may have its own dedicated source of activated species (activated species) 1130. Likewise, the loadlock 1104 may have a source of activated species 1132. There are of course many variations possible, one of which having one single RPC chamber servicing both the transport chamber 1102 and the loadlock 1104.

The need to clean auxiliary chambers associated with the process chamber 202 stems in part from the use of a process gas, such as silane, which has the potential to diffuse into the transfer chamber 1102 and the loadlock 1104 after the processing of a substrate. This is particularly true if the slit door 1118 is opened immediately upon completion of a PECVD process using a silane gas. Residual silane can react with the small amounts of water vapor that naturally occur on surfaces of the transfer chamber 1102, and the loadlock 1104, which may have been introduced from the outside environment after loading a substrate. Alternatively, water vapor may simply have permeated into the system due to leaks in the chamber walls. Whatever the source of the water vapor, a reaction of a residual process gas such as silane with water that has permeated into the chamber is undesirable because of a gradual buildup of particles from the reaction between silane and water. Special purges and pump-down procedures at the end of a process may be performed to reduce the concentration of residual process gases, but the need to perform such purges can reduce the throughput of a system, and may not be completely effective in eliminating particles in any event.

Another problem addressed by embodiments of the present invention is determining the point at which the RPC process should be terminated, commonly known as endpoint detection. The endpoint of a direct plasma clean may be determined by spectroscopically analyzing a glow discharge of the plasma generated directly within the process chamber to determine the relative abundance of various species within the processing chamber. The species emission intensity, or ratios thereof, may be monitored and the direct plasma cleaning process is terminated when the emission intensity reaches a certain threshold value. With RPC techniques, however, the plasma is generated in a separate, detached chamber from the processing chamber. Because conventional RPC processes do not utilize a plasma within the processing chamber, spectroscopic analysis to determine species emission intensity generally cannot be performed. Conventional techniques for determining the endpoint of a RPC process typically use an RGA (residual gas analyzer) and IR (infrared) monitoring, but these techniques are expensive and difficult to implement.

Aspects of the present invention provide endpoint detection of the RPC process by igniting a second low power plasma inside the processing chamber from the activated species delivered by the remote plasma generator and the by-products of the clean and then monitoring specific plasma emission lines in the second plasma. This aspect of the present invention may be advantageously used with the equipment described above for generating the process plasma during substrate processing. It should be noted that the second plasma ignited from the products of the remote plasma is not of a sufficiently high power level to affect any significant cleaning operation, and is maintained primarily for generating emission lines. For example, the power coupled to the second plasma generated within the processing chamber may be less than about 800 watts. The power coupled to the second plasma is kept low to reduce the potential for damaging process chamber components, but high enough to achieve acceptable optical endpoint detector signal levels. Between 200 to 800 watts of power coupled to the second plasma would be appropriate for this purpose. By utilizing these aspects of the present invention, the second plasma may be monitored during the remote plasma cleaning process to determine the relative abundance of various species and by-products within the processing chamber. The remote plasma cleaning process can then be terminated in response to the intensity of the species or by-products, or ratios thereof, reaching a predetermined threshold and stability range indicating a completely clean chamber.

Figure 12:
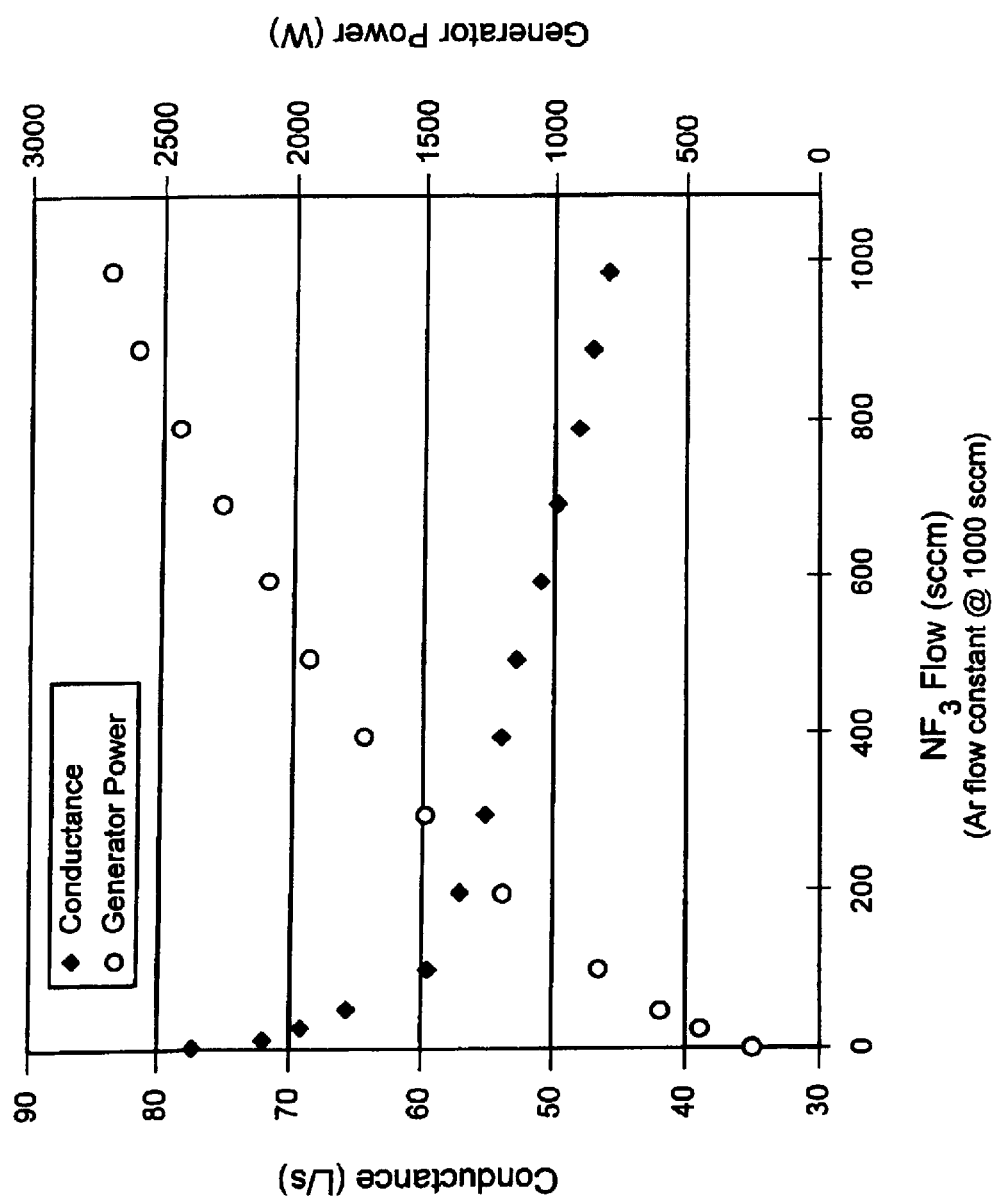
FIG. 12 is a graph of an exemplary conductance measurement of the RPC delivery system transporting activated species from the remote plasma generator to the processing chamber, plotted simultaneously with the power supplied by the remote plasma power supply to the RPC chamber.

It has been previously discussed that maximizing the conductance of the RPC delivery system for the RPC chamber to the processing chamber realizes numerous advantages. To illustrate one of these advantages, FIG. 12 shows conductance in liters per second of an exemplary remote plasma gas RPC delivery system as a function of $NF_3$ addition to a constant Ar carrier gas flow of 1,000 sccm, and a process chamber pressure of about 1 Torr. For $NF_3$ flows from 10 to 1,000 sccm the conductance of the RPC delivery system decreases from approximately 70 liters per second to approximately 45 liters per second at the highest measured flow. This is substantially higher than the conductance of a typical showerhead gas distribution system, which can be on the order of 4 to 10 liters per second at similar flows and pressures.

FIG. 12 also shows a graph of exemplary remote plasma chamber power as a function of $NF_3$ addition to a constant Ar carrier gas flow of 1,000 sccm and a process chamber pressure of 1 Torr. The graph shows that when no $NF_3$ is present in the feed the plasma generator operates at approximately 250 watts. When $NF_3$ is increased from 10 to 1000 sccm the remote power supply also increases the power supplied to the plasma where a flow of 1,000 sccm requires about 2,700 watts.

While the present invention has been described with reference to exemplary embodiments, it will be readily apparent to those skilled in the art that the invention is not limited to the disclosed embodiments but, on the contrary, is intended to cover numerous other modifications and broad equivalent arrangements that are included within the spirit and scope of the following claims.

What is claimed is:

1. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber;

wherein the at least one input port for introducing activated species into the processing chamber comprises an opening formed in a sidewall of the processing chamber;

wherein the at least one input port for introducing activated species into the processing chamber includes a viewport formed therein for enabling a user to view the interior of the processing chamber.

2. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber;

wherein the processing chamber comprises a first processing station for processing a first substrate and a second processing station for processing a second substrate.

3. The system of claim 2, wherein the at least one input port for introducing activated species into the processing chamber comprises a first input port spatially separated from a second input port, the first input port supplying activated species to the first processing station, and the second input port supplying activated species to the second processing station.

4. The system of claim 2, wherein the at least one input port for introducing process gases into the processing chamber comprises a third input port spatially separated from a fourth input port, the third input port supplying process gases to the first processing station, and the fourth input port supplying process gases to the second processing station.

5. The system of claim 4, wherein the processing chamber includes an exhaust port disposed between the third input port and the fourth input port for exhausting gases from the processing chamber.

6. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber;

wherein the processing chamber further includes an exhaust system; and wherein the at least one input port for introducing process gases is coupled to the exhaust system to periodically reverse gas flow direction to draw activated species through the input port for introducing process gases and out of the processing chamber.

7. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber;

wherein the delivery system comprises an inner tube of a coaxial inject/exhaust assembly.

8. The system of claim 7, wherein the coaxial inject/exhaust assembly is located in a central portion of the processing chamber.

9. The system of claim 7, wherein the processing chamber includes a plurality of exhaust ports disposed around a peripheral portion of the processing chamber.

10. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber; and a susceptor support plate for supporting a susceptor; and wherein each of the plurality of exhaust ports are coupled to a flow channel formed in the susceptor support plate, the flow channels directing exhaust gases toward a central portion of the processing chamber and then toward an outer tube of a coaxial inject/exhaust assembly.

11. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber; and a delivery system coupled to the chamber and coupled to the at least one input port for introducing activated species into the processing chamber;

wherein the delivery system further includes an optical baffle disposed within a portion of the delivery system adjacent to the chamber, the optical baffle configured to substantially block line-of-sight exposure of downstream components of the delivery system from the chamber.

12. The system of claim 11, wherein the optical baffle is disposed within an output tube of the delivery system.

13. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber;

a delivery system coupled to the chamber and coupled to the at least one input port for introducing activated species into the processing chamber; and a substrate transport chamber separated from the processing chamber via a door, the door to the substrate transport chamber configured to periodically open to allow activated species to clean the substrate transport chamber.

14. The system of claim 13, further comprising one or more substrate vacuum loadlocks separated from the substrate transport chamber via a door, the doors to the loadlocks configured to periodically open to allow activated species to clean the loadlocks.

15. A system for performing a remote plasma clean, the system comprising:

a chamber configured to generate activated species;

a processing chamber for processing substrates, the processing chamber located remotely from the chamber;

the processing chamber including at least one input port for introducing process gases into the processing chamber for processing substrates, and at least one input port for introducing activated species into the processing chamber for cleaning the processing chamber;

a delivery system coupled to the chamber and coupled to the at least one input port for introducing activated species into the processing chamber; and a substrate transport chamber positioned adjacent to the processing chamber, wherein the delivery system is configured to provide activated species from the chamber to the transport chamber for cleaning the transport chamber.

16. The system of claim 15 further comprising one ore more substrate vacuum loadlocks connected to the substrate transport chamber, wherein the delivery system is configured to provide activated species from the chamber to the loadlocks for cleaning the loadlocks.

* * * * *